(12) United States Patent
Franz et al.

(10) Patent No.: US 6,972,956 B2
(45) Date of Patent: Dec. 6, 2005

(54) COLLAPSIBLE FAN AND SYSTEM AND METHOD INCORPORATING SAME

(75) Inventors: John Franz, Houston, TX (US); Wade Vinson, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 87 days.

(21) Appl. No.: 10/345,785

(22) Filed: Jan. 16, 2003

(65) Prior Publication Data

US 2004/0141288 A1    Jul. 22, 2004

(51) Int. Cl.$^7$ .............................. H05K 7/20; F01D 5/00
(52) U.S. Cl. ..................... 361/695; 361/687; 415/66
(58) Field of Search ................. 361/683, 687, 361/692, 695; 454/184; 165/80.3, 80.4, 165, 165/185, 104.33; 415/1, 68, 141; 416/142, 416/143, 186 A, 88, 223 B, 5, 146 R, 170 R, 416/210 R; 248/519, 523, 529

(56) References Cited

U.S. PATENT DOCUMENTS

| | | | |
|---|---|---|---|
| 3,591,311 A | | 7/1971 | Butler |
| 3,914,069 A | | 10/1975 | Arrington et al. |
| 3,982,853 A | | 9/1976 | Beck |
| 4,095,919 A | * | 6/1978 | Ehrenskjold et al. ........ 416/142 |
| 4,204,806 A | | 5/1980 | Blanchard |
| 4,310,285 A | | 1/1982 | Blanchard |
| 4,383,797 A | | 5/1983 | Lee |
| 4,394,109 A | * | 7/1983 | Ritchie .................. 416/142 |
| 4,396,352 A | * | 8/1983 | Pearce ................... 416/206 |
| 4,565,494 A | * | 1/1986 | Dinger ................... 416/206 |
| 4,776,761 A | * | 10/1988 | Diaz ......................... 416/5 |
| 4,979,876 A | | 12/1990 | Chapman |
| 5,498,134 A | * | 3/1996 | Ibekwe .................. 416/142 |
| 5,638,797 A | * | 6/1997 | Kim ..................... 123/592 |
| 6,027,309 A | * | 2/2000 | Rawls et al. ................. 416/5 |
| 6,152,693 A | | 11/2000 | Olsen et al. |
| 6,386,826 B1 | * | 5/2002 | Jacob ................... 415/125 |
| 6,547,519 B2 | * | 4/2003 | deBlanc et al. .......... 415/141 |
| 6,595,754 B2 | * | 7/2003 | Kuang ................. 416/210 R |
| 6,676,376 B2 | * | 1/2004 | Kerr, Jr. ................ 416/142 |
| 6,699,013 B2 | * | 3/2004 | Zweighaft et al. ........... 416/1 |
| 6,767,186 B2 | * | 7/2004 | Olesiewicz ............. 416/136 |
| 6,860,713 B2 | * | 3/2005 | Hoover ................... 415/66 |
| 2004/0101406 A1 | * | 5/2004 | Hoover .................. 416/140 |

FOREIGN PATENT DOCUMENTS

| | | | | |
|---|---|---|---|---|
| DE | 1916381 B | * | 9/1976 | ......... F04D 25/14 |
| DE | 004014503 A | * | 11/1991 | ............ B60T 5/00 |
| EP | 0011552 A1 | | 5/1980 | |
| EP | 0011552 B1 | | 5/1980 | |

(Continued)

OTHER PUBLICATIONS

Article: "Ultra Reliable Fan", IBM Technical Disclosure Bulletin, Mar. 01, 1996, vol. # 39, Issue # 3, p. # 345-346.*

Primary Examiner—Michael Datskovskiy

(57) ABSTRACT

A collapsible fan. The collapsible fan may be disposed in parallel or series with one or more other fans. If the collapsible fan becomes inactive or non-operable, such as by malfunction or failure, then its fan blades collapse to a less restrictive flow configuration allowing the remaining fans to operate more effectively. The fan blades may have any suitable expansion and contraction mechanism, such as a hinge, a pivot joint, or a multi-section inner or outer support structure having different sections of the fan blades.

22 Claims, 5 Drawing Sheets

FOREIGN PATENT DOCUMENTS

| | | | |
|---|---|---|---|
| EP | 0477145 A1 | 3/1992 | |
| EP | 1239163 A1 | 9/2002 | |
| FR | 2321057 A * | 4/1977 | ........... F04D 29/32 |
| JP | 407158590 A * | 6/1995 | ........... F04D 29/30 |
| JP | 409126191 A * | 3/1997 | ........... F04D 29/38 |
| JP | 411243667 A * | 9/1999 | ........... H02K 9/00 |

* cited by examiner

COLLAPSIBLE FAN AND SYSTEM AND METHOD INCORPORATING SAME

BACKGROUND OF THE INVENTION

This section is intended to introduce the reader to various aspects of art, which may be related to the present subject matter described and/or claimed below. The discussion is believed to be helpful in providing the reader with background information to facilitate a better understanding of the present subject matter. Accordingly, it should be understood that these statements are to be read in this light, and not as admissions of prior art.

Fans may be used for a wide variety of heating, cooling, and fluid transport applications. For example, fans are used for cooling in applications ranging from electronic components to large industrial systems. In personal computer systems, one or more fans blow air across the processor and other computer components. In servers, one or more fans may be provided for redundancy. Other applications also may use a plurality of fans to facilitate component cooling. Unfortunately, if one of these cooling fans ceases to operate, then the dysfunctional fan may block the airflow and inhibit the cooling performance of the one or more remaining cooling fans.

BRIEF DESCRIPTION OF THE DRAWINGS

Exemplary embodiments will hereafter be described with reference to the accompanying drawings, wherein like reference numerals denote like elements, and.

DETAILED DESCRIPTION

As discussed in detail below, the illustrated embodiments comprise a variety of unique fans having multi-sectional and/or collapsible fan blades, which enable these fans to transform between expanded and collapsed configurations. In the expanded configurations, the illustrated embodiments can actively force a medium to create a desired cooling or heating flow. The medium may comprise a liquid, a solid, a gas, a multi-phase medium, or any other transportable medium. If inoperable or generally not driven, the illustrated embodiments may be transformed into the collapsed configurations, thereby allowing airflows created by other fans to flow more freely through the inoperable unit. Absent the collapsed configurations, the inoperable fans could substantially block or restrict the airflows created by the other fans. The potential for flow blockage is the greatest with high-performance fans having high flow coverage, e.g., a large number of wide-span fan blades or other aerodynamic characteristics. Accordingly, the collapsed configurations of the illustrated embodiments can be increasingly effective at freeing the airflow of inoperable fans, which have increasingly higher performance aerodynamic characteristics. These aerodynamic characteristics may correspond to fan blade or impeller numbers, pitch, camber, stagger, width, length, and other flow enhancing features.

Figure 1:
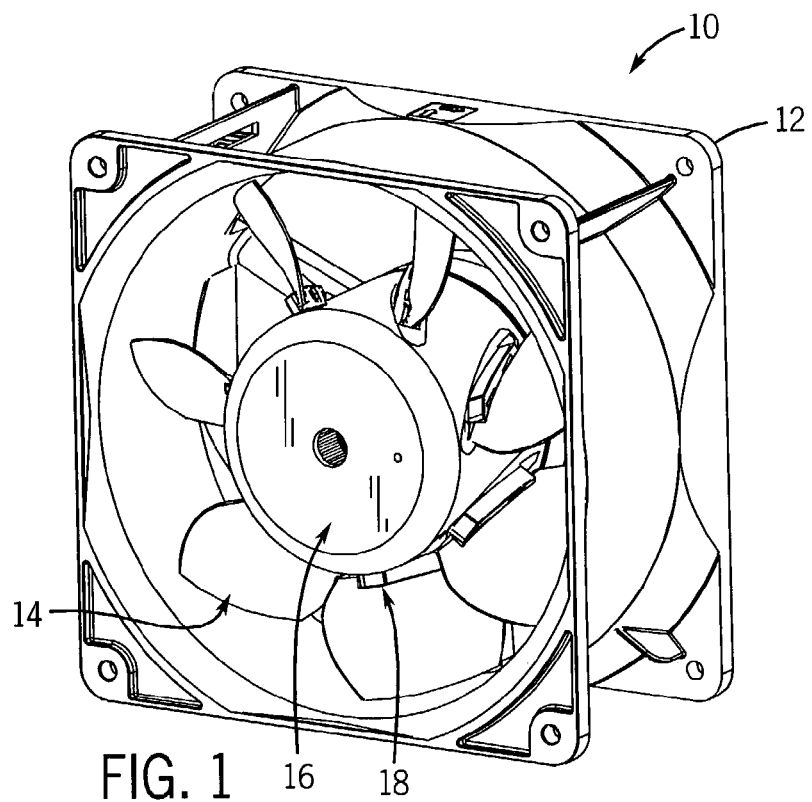
FIG. 1 is a front perspective view illustrating a collapsible fan in accordance with certain embodiments of the present technique.

Turning now to the Figures, several embodiments of a collapsible fan are illustrated in light of the foregoing discussion. FIG. 1 is a perspective view illustrating a collapsible fan 10 in accordance with certain embodiments of the present subject matter. As illustrated, the collapsible fan 10 comprises a modular housing 12 in which a plurality of fan impellers or blades 14 are rotatably coupled to a hub 16 via hinges 18. It should be noted that the collapsible fan 10 may be adapted to any system or device, heating or cooling mechanism, or flow-inducing application. For example, the collapsible fan 10 may be incorporated into a multi-fan heating and/or cooling system, such as a cooling system disposed in a rack mount server, a desktop computer, a laptop computer, a tablet computer, a palmtop computer, or another processor-based device. Other possible applications may include industrial heat transfer and/or fluid transfer systems, such as those found in chemical plants, nuclear facilities, natural resource refineries and other facilities, water treatment facilities, waste processing systems, and various other systems depending on uninterrupted flows. The collapsible fan 10 also may be disposed in a fluid transport system, such as a fluid pumping system, an oil retrieval and/or transport system, or multi-phase flow systems. For example, the collapsible fan 10 may transport a solid carried by a fluid transport medium. In any application, the collapsible fan 10 may be disposed in series, in parallel, or in a generally redundant position with another fan unit, which also may embody collapsible aspects of the fan 10. If the collapsible fan 10 ceases to operate, then the blades 14 collapse into a relatively less flow restrictive configuration. The remaining fan units can then operate more efficiently and effectively than would otherwise be possible without the collapsed configuration of the fan 10 (i.e., in an inactive state).

FIGS. 2–5 are side and front views illustrating expanded and collapsed configurations of the collapsible fan 10 illustrated in FIG. 1 in accordance with certain embodiments of the present subject matter. In some of these embodiments, the collapsible fan 10 is illustrated without the modular housing 12. However, any suitable housing structure may be incorporated into the collapsible fan 10 to facilitate mounting within the desired device or system.

Figures 2, 3:
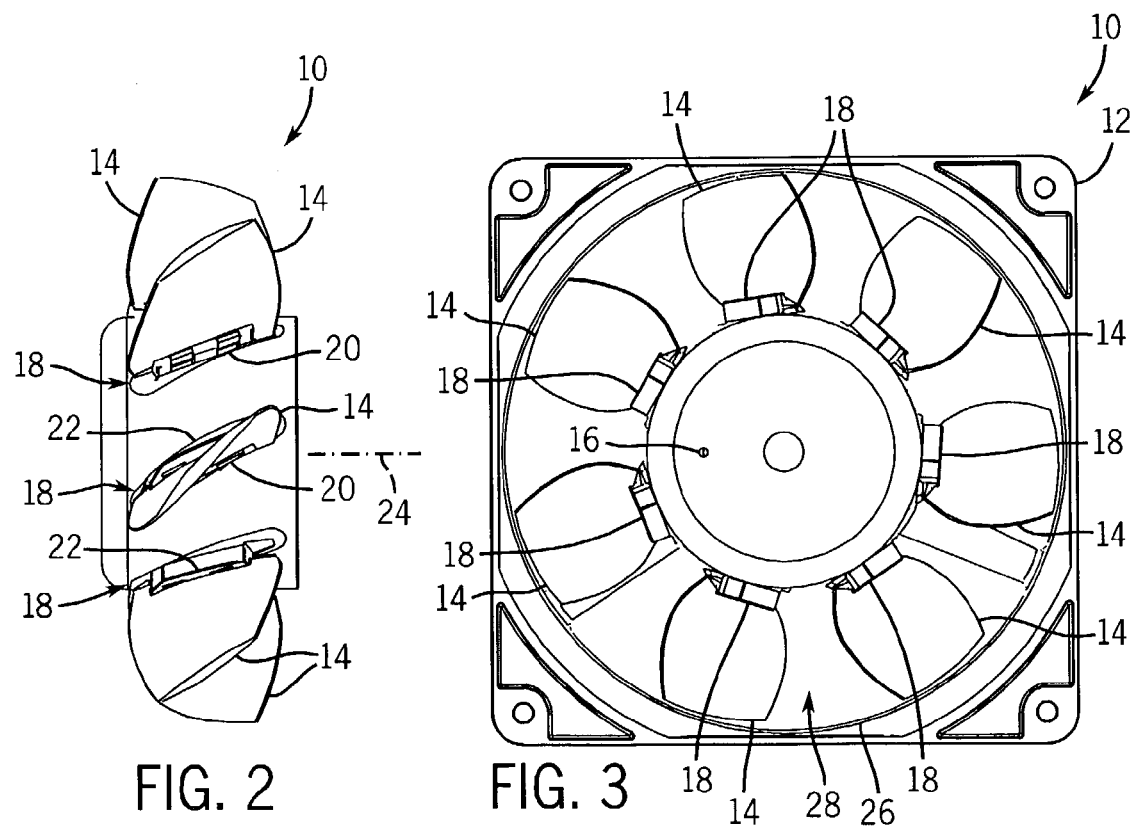
FIGS. 2, 3, 4, and 5 are side and front views illustrating expanded and collapsed embodiments of the collapsible fan illustrated in FIG. 1.

Turning now to FIG. 2, unique aspects of the collapsible fan 10 are illustrated with reference to the hinges 18. As illustrated, each of the plurality of hinges 18 comprises a rotational hinge mechanism 20 and a rotational stop mechanism 22, which is disposed at an upright angle relative to the hub 16. In operation, the blades 14 are expanded about the rotational hinge mechanisms 20 to the upright angle at the rotational stop mechanism 20. In this upright or expanded configuration, the blades 14 can be driven in a rotational motion to create a desired flow. For example, a rotational drive or electric motor may be provided to rotate the hub 16 about a rotational axis 24. As the hub 16 is rotated about the rotational axis 24, aerodynamic and/or rotational forces may facilitate the foregoing expansion of the blades 14 to the expanded or upright angle. Alternatively, a variety of actuators may be provided to facilitate the transformation between the upright expanded configuration and a collapsed configuration of the blades 14. For example, the hinges 18 may comprise a wide variety of mechanical, electrical, or electro-mechanical actuators, such as a spring, a magnetic actuator, a servo-mechanism, or any other suitable expansion-inducing or contraction-inducing mechanism. Regardless of the actuator, the expanded blades 14 can effectively force a medium (e.g., gas, liquid, multi-phase, etc.) through the desired system or device, while the collapsed blades 14 allow other fans to flow the medium more freely through the fan 10.

In operation, the expanded blades 14 extend across a relatively greater portion of the flow passage than that of the blades 14 disposed in a collapsed configuration. As illustrated in FIG. 3, the blades 14 are disposed in an expanded configuration within a flow passage 26 of the modular housing 12. If the collapsible fan 10 is actively rotated by a drive mechanism, then the fan 10 itself actually forces a medium (e.g., gas, liquid, multi-phase, etc.) through the flow passage 26. However, absent the collapsible mechanism of the illustrated embodiment, the blades 14 would otherwise limit the flow to a restricted flow area 28 passing between the plurality of blades 14 if the collapsible fan 10 ceased to operate, e.g., due to drive failure, mechanical failure, electrical failure, etc.

Figure 4:
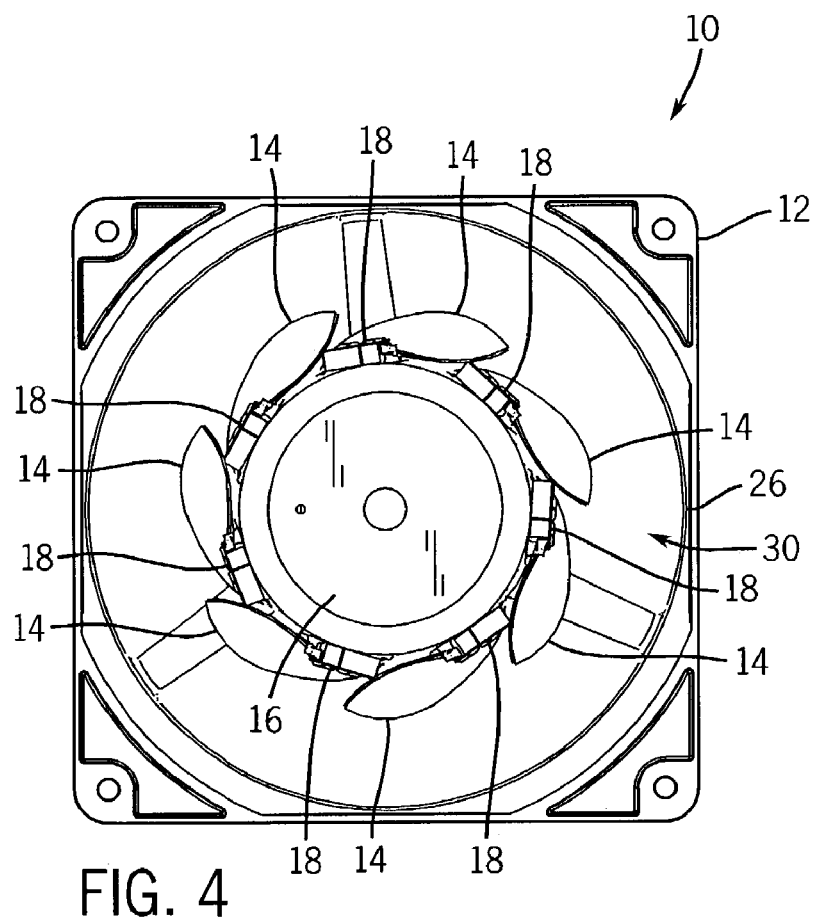
Figure 5:
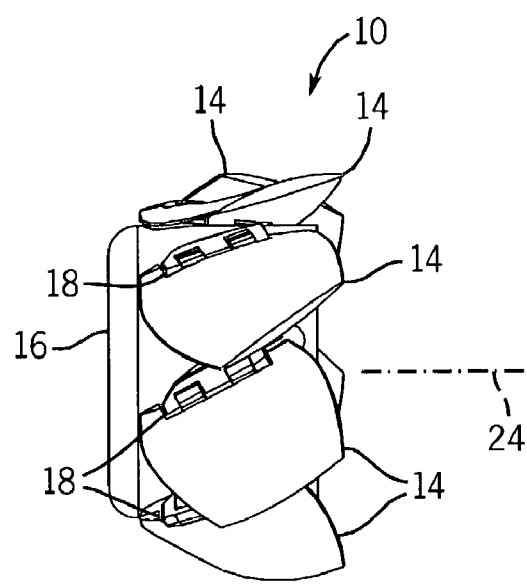

As mentioned above, in an operational or dysfunctional state of the collapsible fan 10, the hinges 18 allow the blades 14 to collapse inwardly upon the hub 16 to expand the flow area 28 to a greater portion of the flow passage 26, as illustrated in FIGS. 4 and 5. In the embodiment of FIG. 4, the blades 14 have been collapsed onto the hub 16 to create a free flow area 30 between the collapsed blades 14 and the flow passage 26 of the modular housing 12. It should be noted that the collapsing of the blades 14 may be induced by gravity (i.e., weight of the blades 14), flow provided by one or more other fan units (i.e., aerodynamic force), rotational forces (e.g., centrifugal, centripetal, tangential, etc.), or any other suitable actuator. For example, as noted above, the hinges 18 may comprise a wide variety of mechanical, electrical, or electro-mechanical actuators, such as a spring, a magnetic actuator, a servo-mechanism, or any other suitable expansion-inducing or contraction-inducing mechanism. In one embodiment, one of these actuators (e.g., a spring) may be disposed along an axis of the hinges 18 to bias the blades 14 toward the hub 16. If the collapsible fan 10 ceases to operate (i.e., rotation stops), then the foregoing actuators may automatically collapse the blades 14 onto the hub 16. Again, any suitable actuator or transformation mechanism is within the scope of the illustrated embodiments. As a result, other fans can force a medium (e.g., gas, liquid, multi-phase, etc.) through the inactive collapsible fan 10 more freely than otherwise possible without the collapsible configuration of the blades 14.

Figures 6, 7:
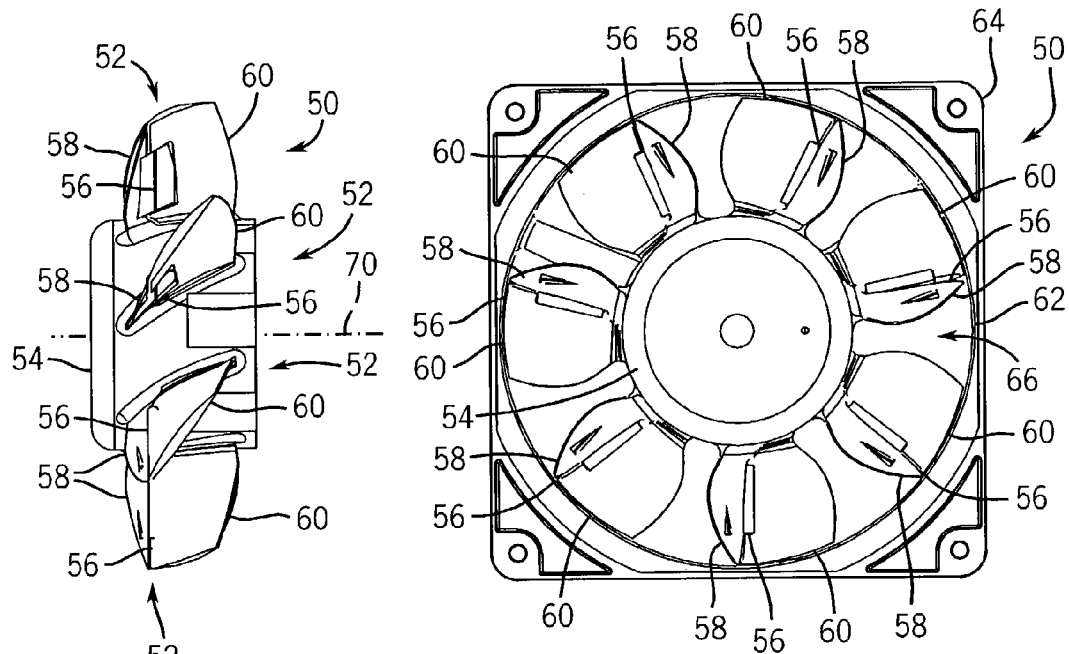
FIG. 6 is a side view illustrating an alternative collapsible fan in accordance with certain embodiments of the present technique.
FIGS. 7, 8, and 9 are front and side views illustrating expanded and collapsed embodiments of the collapsible fan illustrated in FIG. 6.

Turning now to FIGS. 6–9, embodiments of an alternative collapsible fan 50 are illustrated in accordance with certain embodiments of the present subject matter. In some of these embodiments, the collapsible fan 50 is illustrated without a housing or mount structure. However, any suitable housing or mount structure may be incorporated into the collapsible fan 50 to facilitate mounting within the desired device or system. FIG. 6 is a side view illustrating certain features of the alternative collapsible fan 50 in light of the foregoing discussion. As illustrated, the collapsible fan 50 comprises a plurality of multi-section fan impellers or collapsible blades 52 coupled to a hub 54 in a circumferential arrangement around the hub 54. As with the fan 10, the collapsible fan 50 may be adapted to any system or device, heating or cooling mechanism, or flow-inducing application. For example, the collapsible fan 50 may be incorporated into a multi-fan cooling system, such as one disposed in rack mount servers and other computer systems. In any application, the collapsible fan 50 may be disposed in series, in parallel, or in a generally redundant position with another fan unit, which also may embody collapsible aspects of the fan 50. If the collapsible fan 50 ceases to operate, then the blades 52 collapse into a relatively less flow restrictive configuration. The remaining fan units can then operate more efficiently and effectively than would otherwise be possible without the collapsed configuration of the fan 50 (i.e., in an inactive state).

As illustrated, the multi-section fan impellers or collapsible blades 52 are transformable via hinges 56, which rotatably couple blade sections 58 and 60 between expanded and collapsed configurations. These hinges 56 extend outwardly from the hub 54 along an upright rotational axis, which facilitates the rotation of at least one of the two blade sections 58 and 60. For example, the blade sections 58 may be fixedly coupled to the hub 54, while the blade sections 60 can rotate between an expanded position (i.e., angled relative to the flow) and a collapsed position (i.e., aligned substantially with the flow). In this manner, the expanded position of the blade sections 58 is aerodynamically active, while the collapsed position is relatively inactive and non-flow-restrictive.

In operation, the blade sections 60 are expanded about the hinges 56 such that both blade sections 58 and 60 are angled relative to the flow, thereby forcing a desired flow as the hub 54 is driven by a suitable drive mechanism. For example, as the hub 54 is rotated by the drive mechanism, aerodynamic forces may facilitate the foregoing expansion of the blade sections 60 to the expanded aerodynamically active fanning positions. Alternatively, a variety of actuators may be provided to facilitate the transformation between the expanded and collapsed configuration of the blades 52. For example, the hinges 56 may comprise a wide variety of mechanical, electrical, or electro-mechanical actuators, such as a spring, a magnetic actuator, a servo-mechanism, or any other suitable expansion-inducing or contraction-inducing mechanism. Regardless of the actuator, the expanded blades 52 can effectively force a medium (e.g., gas, liquid, multi-phase, etc.) through the desired system or device, while the collapsed blades 52 can more freely pass a flow driven by other fans.

It also should be noted that the collapsible fan 50 may have one or more blade retention mechanisms, such as a protruding member, a slot, a pin, or any other suitable stop, which retain the blade sections 60 in either one or both of the expanded and collapsed positions. For example, the blade sections 60 may be rotatable between a pair of opposite pins, opposite stops, opposite edges of a recessed area for the blade sections 60, or any other opposing members disposed at the expanded and collapsed positions. In operation, the blade sections 60 are forced against either one of the opposing members via aerodynamic forces, rotational forces, gravity, springs, or other rotation-inducing mechanisms.

Figures 8, 9:
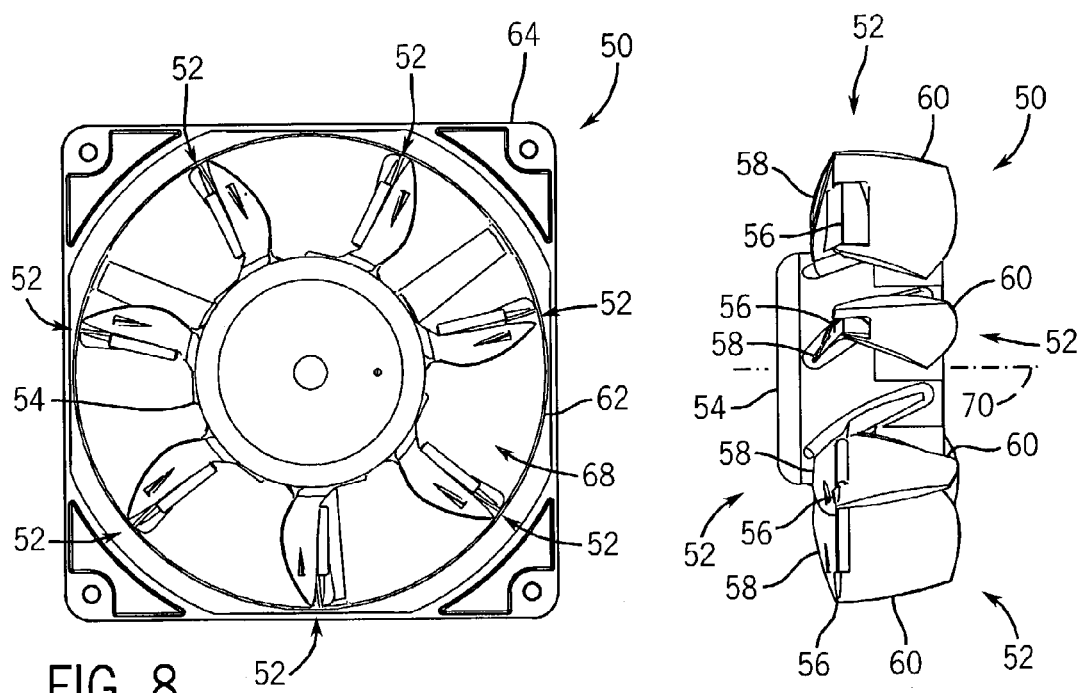

FIGS. 7–9 are front and side views illustrating expanded and collapsed configurations of the collapsible fan 50 illustrated in FIG. 6 in accordance with certain embodiments of the present subject matter. In the expanded positions, the blade sections 58 and 60 extend across a relatively greater portion of the flow passage than that of the collapsed configuration. In FIG. 7, the blades 52 are disposed in an expanded configuration within a flow passage 62 of a modular housing 64. If the collapsible fan 50 is actively rotated by a drive mechanism, then the fan 50 itself actually forces a medium (e.g., gas, liquid, multi-phase, etc.) through the flow passage 62. However, absent the collapsible mechanism of the illustrated embodiment, the blades 52 would otherwise limit the flow to a restricted flow area 66 passing between the plurality of blades 52 if the collapsible fan 50 ceased to operate, e.g., drive failure, mechanical failure, electrical failure, etc.

As mentioned above, in an operational or dysfunctional state of the collapsible fan 50 (e.g., a faulty drive mechanism), these hinges 56 allow the blade sections 60 to collapse inwardly toward the direction of flow through the fan 50, thereby opening the restricted flow area 66 as illustrated in FIGS. 8 and 9. In the embodiment of FIG. 8, the blade sections 58 and 60 have been collapsed or compacted into relatively lower profile blades 52, which form a free flow area 68 between the collapsed blades 52 and the flow passage 62 of the modular housing 64. It should be noted that the collapsing of the blades 52 may be induced by gravity (i.e., weight of the blades 52), flow provided by one or more other fan units (i.e., aerodynamic force), or other suitable actuators. For example, as noted above, the hinges 56 may comprise a wide variety of mechanical, electrical, or electro-mechanical actuators, such as a spring, a magnetic actuator, a servo-mechanism, or any other suitable expansion-inducing or contraction-inducing mechanism. In one embodiment, one of these actuators (e.g., a spring) may be disposed along an axis of the hinges 56 to bias the blade sections 60 in substantial alignment with the flow (i.e., a longitudinal axis 70). If the drive mechanism stops rotating the collapsible fan 50, then the foregoing actuators may automatically collapse the blades 52 onto the hub 54. For example, if the aerodynamic forces and/or rotational forces cease to retain the blade sections 60 in the expanded configuration, then a spring or other biasing mechanism may collapse the blades 52. Again, any suitable actuator or transformation mechanism is within the scope of the illustrated embodiments. As a result, other fans can force a medium (e.g., gas, liquid, multi-phase, etc.) through the inactive collapsible fan 50 more freely than otherwise possible without the collapsible configuration of the blades 52.

Figures 10, 11:
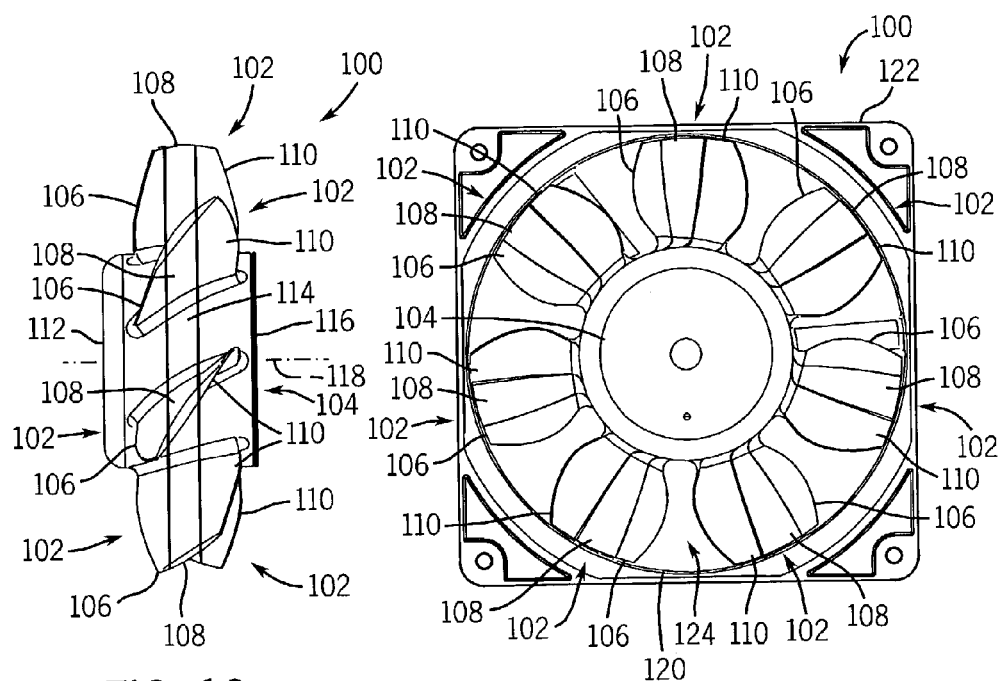
FIG. 10 is a side view illustrating a further alternative collapsible fan in accordance with certain embodiments of the present technique.
FIGS. 11, 12, and 13 are front and side views illustrating expanded and collapsed embodiments of the collapsible fan illustrated in FIG. 10;1

Turning now to FIGS. 10–13, embodiments of an alternative collapsible fan 100 are illustrated in accordance with certain embodiments of the present subject matter. In some of these embodiments, the collapsible fan 100 is illustrated without a housing or mount structure. However, any suitable housing or mount structure may be incorporated into the collapsible fan 100 to facilitate mounting within the desired device or system. FIG. 10 is a side view illustrating certain features of the alternative collapsible fan 100 in light of the foregoing discussion. As illustrated, the collapsible fan 100 comprises a plurality of multi-section fan impellers or collapsible blades 102 extending from a multi-section hub 104 in a circumferential arrangement around the multi-section hub 104. As with the fans 10 and 50, the collapsible fan 100 may be adapted to any system or device, heating or cooling mechanism, or flow-inducing application. For example, the collapsible fan 100 may be incorporated into a multi-fan cooling system, such as one disposed in rack mount servers and other computer systems. In any application, the collapsible fan 100 may be disposed in series, in parallel, or in a generally redundant position with another fan unit, which also may embody collapsible aspects of the fan 100. If the collapsible fan 100 ceases to operate, then the blades 102 collapse into a relatively less flow restrictive configuration. The remaining fan units can then operate more efficiently and effectively than would otherwise be possible without the collapsed configuration of the fan 100 (i.e., in an inactive state).

As illustrated, each one of the collapsible blades 102 has blade sections 106, 108, and 110, which extend outwardly from hub sections 112, 114, and 116 of the multi-section hub 104. The illustrated multi-blade hub sections 112, 114, and 116 are intercoupled along a rotational axis 118 of the collapsible fan 100, thereby allowing the hub sections 112, 114, and 116 and the corresponding plurality of blade sections 106, 108, and 110 to be collapsed and expanded by rotation among/between the various hub sections 112, 114, and 116. For example, the hub sections 112 and 114 may be rotatably intercoupled with a rotational range of movement, which allows the corresponding blade sections 106 and 108 to be collapsed to a lower profile configuration. In the illustrated low-profile or collapsed configuration positions, the blade sections 106 and 108 are in a longitudinally aligned orientation with the rotational axis 118 (i.e., aligned substantially with the flow). Similarly, the hub sections 114 and 116 may be rotatably intercoupled with a rotational range of movement allowing the corresponding blade sections 108 and 110 to be collapsed to a lower profile configuration. Again, in the illustrated low-profile or collapsed configuration positions the blade sections 108 and 110 are in a longitudinally aligned orientation with the rotational axis 118 (i.e., aligned substantially with the flow). Altogether, the multi-section hub 104 is rotatably collapsible to a longitudinally aligned configuration of all three hub sections 112, 114, and 116, thereby substantially reducing the flow restriction of the blades 102. As noted above, the blades 102 also are expandable for normal operation of the collapsible fan 100 (i.e., all blade sections 106, 108, and 110 are angularly disposed in the flow). For example, if the multi-section hub 104 is rotated by a drive mechanism, then the rotational and/or aerodynamic forces on the blade sections 106, 108, and 110 may induce the hub sections 112, 114, and 116 to rotate and angularly align the blade sections 106, 108, and 110 relative to the rotational axis 118 and the flow. In this expanded configuration, each set of the blade sections 106, 108, and 110 forms a continuous fanning surface, which can actively force a medium (e.g., gas, liquid, multi-phase, etc.) to flow through the desired system or device.

To facilitate the foregoing transformations, the multi-section hub 104 may comprise a variety of rail structures, slidable interlocks, and angular stop mechanisms extending between the hub sections 112, 114, and 116. For example, the multi-section hub 104 may comprise one or more mechanical, electrical, or electro-mechanical positioning mechanisms and/or actuators, such as a spring-biased collapsing mechanism, a magnetic actuator, a servo-mechanism, rotationally-induced expansion/contraction mechanism (e.g., centrifugal, centripetal, or tangential forces), aerodynamically-induced expansion mechanism, or any other suitable expansion-inducing or contraction-inducing mechanism. The illustrated collapsible fan 100 also may have one or more blade retention mechanisms, such as a protruding member, a slot, a pin, or any other suitable stop, which retain the blade sections 106, 108, and 110 in either one or both of the expanded and collapsed positions. For example, the blade sections 106, 108, and 110 may be rotatable between a pair of opposite pins, opposite stops, opposite edges of a recessed area for the blade sections, or any other opposing members disposed at the expanded and collapsed positions. In operation, the blade sections 108 may be forced against either one of the opposing members via aerodynamic forces, rotational forces (e.g., centrifugal, centripetal, tangential, etc.), gravity, springs, or other rotation-inducing mechanisms. Regardless of the positioning mechanisms and/or actuators, the expanded multi-section blades 102 can effectively force a medium (e.g., gas, liquid, multi-phase, etc.) through the desired system or device, while the collapsed multi-section blades 102 can more freely pass a flow driven by other fans.

Figures 12, 13:
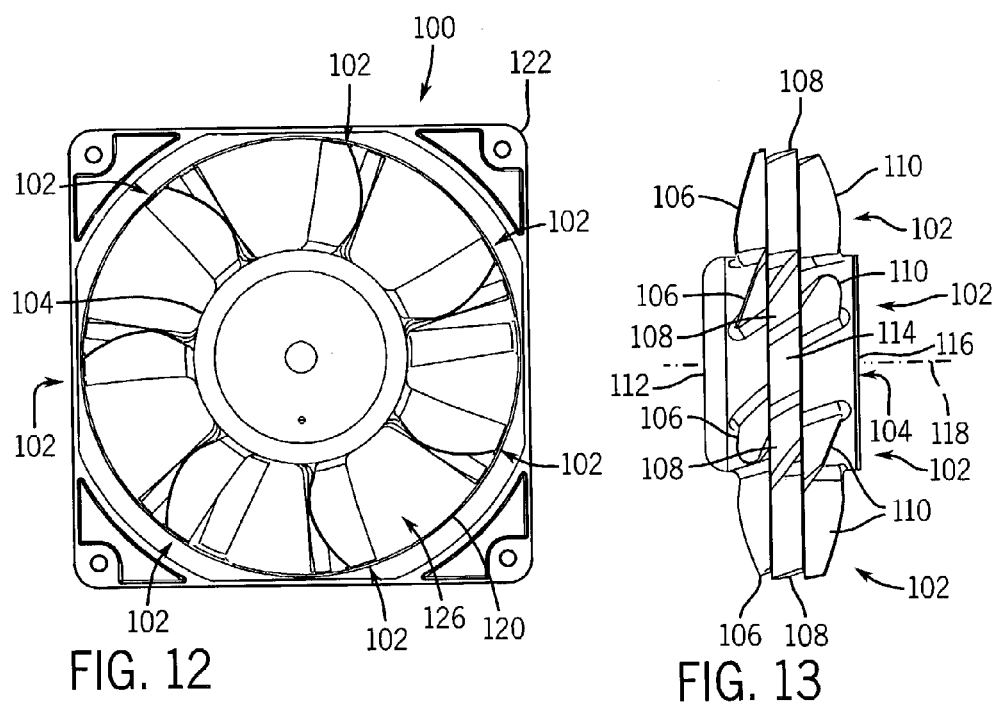

FIGS. 11–13 are front and side views illustrating expanded and collapsed configurations of the collapsible fan 100 illustrated in FIG. 10 in accordance with certain embodiments of the present subject matter. In the expanded positions, the blade sections 106, 108, and 110 extend across a relatively greater portion of the flow passage than that of the collapsed configuration. In FIG. 11, the multi-section blades 102 are disposed in an expanded configuration within a flow passage 120 of a modular housing 122. If the collapsible fan 100 is actively rotated by a drive mechanism, then the fan 100 itself actually forces a medium (e.g., gas, liquid, multi-phase, etc.) through the flow passage 120. However, absent the collapsible mechanism of the illustrated embodiment, the expanded multi-section blades 102 would otherwise limit the flow to a restricted flow area 124 passing between the plurality of blades 102 if the collapsible fan 100 ceased to operate, e.g., drive failure, mechanical failure, electrical failure, etc.

As mentioned above, in an operational or dysfunctional state of the collapsible fan 100 (e.g., a faulty drive mechanism), the multi-sectional and rotatably intercoupled configuration of the hub sections 112, 114, and 116 allows the blade sections 106, 108, and 110 to collapse inwardly toward the direction of flow through the fan 100. As illustrated in FIGS. 8 and 9, the blade sections 106, 108, and 110 have been collapsed or compacted one behind the other along the rotational axis 118 (i.e., longitudinally aligned). In this longitudinally aligned or collapsed configuration, the blades 102 substantially open or expand the restricted flow area 124, thereby defining a larger or free flow area of 126 between the collapsed blades 102 and the flow passage 120 of the modular housing 122.

It should be noted that the contraction and expansion of the blades 102 may be induced by aerodynamic forces (e.g., flow from one or more other fan units impacting the blade sections 106, 108, and 110), rotational forces (e.g., centrifugal, centripetal, tangential, etc.), springs, or any other suitable actuator. In one embodiment, one of these actuators (e.g., a spring) may be disposed in the multi-section hub 104 to bias the hub sections 112, 114, and 116 toward substantial alignment with the flow (i.e., along rotational axis 118). During operation, the rotational forces (e.g., centrifugal, centripetal, tangential, etc.) and/or aerodynamic forces overcome this spring actuator to expand the multi-section hub 104 and corresponding multi-section blades 102. If the drive mechanism stops rotating the collapsible fan 100, then the foregoing spring actuator may automatically rotate the hub sections 112, 114, and 116 to collapse the blade sections 106, 108, and 110. However, any suitable actuator or transformation mechanism is within the scope of the illustrated embodiments. As a result, other fans can force a medium (e.g., gas, liquid, multi-phase, etc.) through the inactive collapsible fan 100 more freely than otherwise possible without the collapsible configuration of the blades 102.

Figure 14:
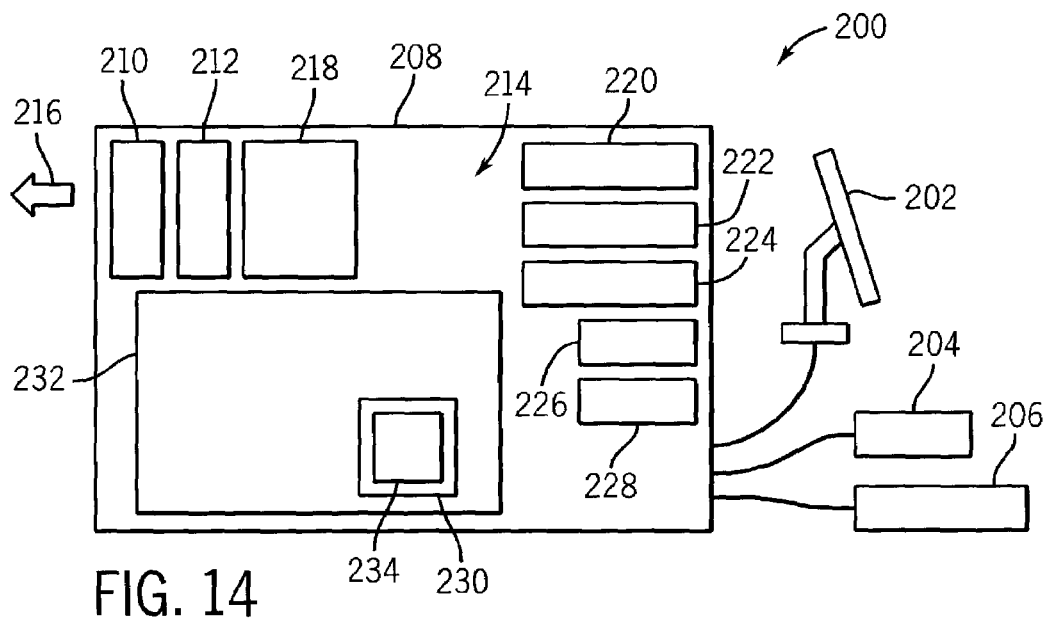
FIG. 14 is a diagrammatical side view illustrating a tower computer system having multiple collapsible fans in accordance with certain embodiments of the present technique.
Figure 15:
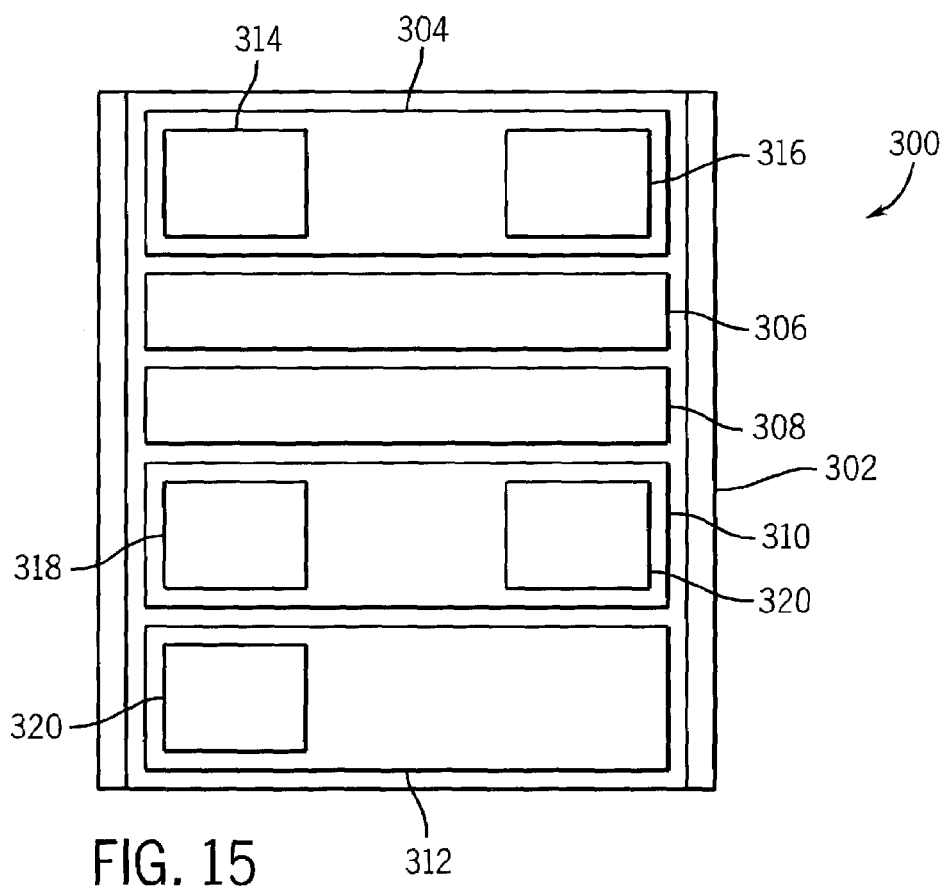
FIG. 15 is a diagrammatical rear view illustrating a rack mount computer system comprising multiple rack-mounted components having collapsible fans in accordance with certain embodiments of the present technique.

As discussed above, the various embodiments of collapsible fans 10, 50, and 100 may be disposed in a wide variety of systems and devices, such as computer systems. FIGS. 14 and 15 are diagrammatical side and rear views illustrating exemplary systems incorporating certain aspects of the foregoing collapsible fans 10, 50, and 100. As illustrated in FIG. 14, a diagrammatical side view of a personal computer system 200 is illustrated with a display 202, a pointing device 204, and a keyboard 206 communicatively coupled to a component housing 208. The illustrated housing 208 is equipped with a pair of collapsible fans 210 and 212 for cooling internal components 214 of the system 200. These collapsible fans 210 and 212 provide an airflow 216, which passes over the internal component 214 during operation of the system 200. As illustrated, the internal components 214 may comprises a power supply 218, various modular drives 220 through 228 (e.g., CD, DVD, floppy disk, hard disk, etc.), and a processor 230 disposed on a motherboard 232. Additionally, the system 200 may include a processor fan 234, which also can include the collapsible features of the embodiments described above. It should be noted that the computer system 200 may embody an type or configuration of computer systems, including home PCs, laptops, personal digital assistants, and other such computers and electronics.

Turning now to FIG. 15, a diagrammatical rear view of a rack mount system 300 is described with certain features of the foregoing collapsible fans 10, 50, and 100. As illustrated, the system 300 comprises a rack structure 302, which supports a plurality of rack mountable devices 304–310 (e.g., network server, web server, security device, etc.). In each of these devices 304–310, one or more collapsible fans may be disposed in series, in parallel, or in redundant positions to transfer heat away from the internal components. For example, the rack mountable device 304 comprises collapsible fans 314 and 316 in a configuration similar to that of system 200. Rack mountable device 310 also includes a similar configuration of collapsible fans 318 and 320. In the rack mountable device 312, a plurality of adjacent collapsible fans 320 are provided for redundancy to ensure continuous cooling in the event that either one of the multiple fans 320 become inoperative. Again, the various embodiments of collapsible fans described above may be mounted, adapted, or otherwise fitted into any desired system or device in addition to those illustrated in FIGS. 14 and 15.

While the subject matter may be susceptible to various modifications and alternative forms, specific embodiments have been shown by way of example in the drawings and will be described in detail herein. However, it should be understood that the subject matter is not intended to be limited to the particular forms disclosed. Rather, the subject matter is to cover all modifications, equivalents and alternatives falling within the spirit and scope of the subject matter as defined by the following appended claims. For example, the collapsible fans 10, 50, and 100 and other embodiments may be adapted to a wide variety of gaseous, liquid, solid, or multi-phase flows for heating/cooling, fluid transport, and other suitable applications. Accordingly, the particular form and configuration of the multiple collapsible blades/impellers may differ from one application to the other. By further example, the transport medium and application may dictate the number or shape of blades/impellers, the materials, the placement of the drive mechanism, and other operational characteristics. In some applications, the drive mechanism (e.g., electric or other motor) may be disposed along the rotational axis of the collapsible fan, while other applications may place the drive mechanism along the outer perimeter or circumference of the collapsible fan. It also should be noted that the blades/impellors may be collapsed along an outer encircling support or annular structure, a central hub, or a combination of outer and inner support structures. Again, any suitable collapsing configuration of blades/impellers is within the scope of the present embodiments.

What is claimed is:

1. A fan, comprising:
a support structure; and
a plurality of collapsible fan blades coupled to the support structure, wherein the plurality of collapsible fan blades comprises multiple blade sections, wherein the multiple blade sections comprise at least first and second blade sections disposed on first and second longitudinally adjacent support structure sections of the support structure.

2. The fan of claim 1, wherein the plurality of collapsible fan blades are flow-inducibly transformable between an active fanning flow configuration and an inactive free flow configuration.

3. The fan of claim 1, wherein the plurality of collapsible fan blades are spring-loaded.

4. A system, comprising:
a housing having an opening; and
a flow-inducing device disposed in the opening and comprising a plurality of collapsible blades, each collapsible blade comprising a first blade segment and a second blade segment rotatably coupled by a hinge, and wherein the first blade segment comprises substantially most of the surface area of the collapsible blade and is rotatable about the hinge relative to the second blade segment.

5. The system of claim 4, wherein the housing comprises electronics and the opening comprises a heat transfer passageway.

6. The system of claim 4, wherein the housing comprises computer components and the opening comprises a cooling passageway extending over the computer components.

7. The system of claim 4, wherein the opening comprises a pumping passageway of a fluid transport system.

8. The system of claim 4, wherein the housing is disposed in a fluid processing system.

9. The system of claim 8, wherein the fluid processing system comprises a natural resource processing system.

10. A flow-inducing system, comprising:
a first fan; and
a second fan disposed in the flow path of the first fan, wherein the first fan comprises fan blades each being rotatable about a central axis of rotation of the first fan, wherein the fan blades comprise at least three blade sections.

11. The flow-inducing system of claim 10, wherein the fan blades comprise an expansion and contraction mechanism adapted to transform the fan blades between a full fan configuration and an non-operational collapsed fan configuration having a relatively less restrictive flow than the full fan configuration.

12. A flow-inducing system, comprising:
a first fan; and
a second fan disposed in the flow path of the first fan, wherein at least one fan of the first and second fans comprises collapsible fan blades, wherein the collapsible fan blades comprises a first segment and a second segment, the second segment being positionable substantially behind the first segment relative to the flow path.

13. A flow-inducing system, comprising:
a first fan; and
a second fan disposed in the flow path of the first fan, wherein the first fans comprises collapsible fan blades, wherein the collapsible fan blades comprise a plurality of multi-sectional fan blades having different blade sections disposed on different axially adjacent sections of a multi-sectional support structure.

14. The flow-inducing system of claim 12, wherein the collapsible fan blades comprise a spring mechanism biasing the collapsible fan blades toward a non-operational collapsed fan configuration.

15. A method for transferring heat, comprising:
flowing a medium through a plurality of fans disposed in a flow path; and
collapsing fan blades of a non-operational fan of the plurality of fans, wherein collapsing fan blades comprises longitudinally stacking sections of each of the fan blades in alignment with the flow path.

16. The method of claim 15, wherein flowing the medium comprises driving at least one of the plurality of fans.

17. A method of manufacture, comprising:
deploying a fan in a device; and
providing the fan with a support structure having a plurality of collapsible fan blades extending from the support structure, each of the collapsible fan blades having a first segment and a second segment, the second segment being positionable behind the first segment relative to a flow direction.

18. The method of claim 17, wherein providing comprises creating the plurality of collapsible fan blades to expand to a full fan configuration under aerodynamic force.

19. The method of claim 17, further comprising adding a second fan adjacent the fan and simultaneously flowing a medium through both the fan and the second fan.

20. The method of claim 17, further comprising automatically moving the plurality of collapsible fan blades to a collapsed position during a non-operational state of the fan.

21. The system of claim 4, wherein the first blade segment is rotatable about the hinge between an angled orientation relative to a flow direction and a substantially parallel orientation relative to the flow direction, wherein the flow direction is substantially aligned with a central axis of rotation of the flow-inducing device.

22. The method of claim 17, wherein the second segment is rotatable about a hinge between an angled orientation relative to the flow direction and a substantially parallel orientation relative to the flow direction, wherein the flow direction is substantially aligned with a central axis of rotation of the fan.

* * * * *